(12) United States Patent
Hu et al.

(10) Patent No.: US 10,784,205 B2
(45) Date of Patent: Sep. 22, 2020

(54) ELECTRONIC PACKAGE

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 81 days.

(21) Appl. No.: 14/990,933

(22) Filed: Jan. 8, 2016

(65) Prior Publication Data

US 2016/0212852 A1 Jul. 21, 2016

(30) Foreign Application Priority Data

Jan. 16, 2015 (CN) .......... 2015 1 0022806

(51) Int. Cl.
| | |
|---|---|
| H05K 5/00 | (2006.01) |
| H05K 1/18 | (2006.01) |
| H01L 23/538 | (2006.01) |
| G06K 9/00 | (2006.01) |
| H01L 27/146 | (2006.01) |

(Continued)

(52) U.S. Cl.
CPC ........ H01L 23/5389 (2013.01); G06K 9/0004 (2013.01); H01L 27/14618 (2013.01); H05K 1/185 (2013.01); H01L 2224/18 (2013.01); H01L 2224/45144 (2013.01); H01L 2224/48091 (2013.01); H01L 2224/48227 (2013.01); H01L 2224/48465 (2013.01); H01L 2924/15311 (2013.01); H01L 2924/16235 (2013.01); H01L 2924/181 (2013.01); H05K 3/284 (2013.01); H05K 2201/10 (2013.01); H05K 2201/10121 (2013.01); H05K 2201/10151 (2013.01)

(58) Field of Classification Search
CPC .... H05K 1/185; H05K 2201/10; H05K 3/284; H01L 31/0232; H01L 31/054; H01L 31/02325
USPC .......................... 361/760, 761, 764, 767, 783; 257/432–434, 678, 680, E33.07
See application file for complete search history.

(56) References Cited

U.S. PATENT DOCUMENTS

2005/0285154 A1* 12/2005 Akram .............. H01L 21/76898
257/234
2007/0108561 A1 5/2007 Webster et al.
(Continued)

FOREIGN PATENT DOCUMENTS

| TW | 200952142 | 12/2009 |
|---|---|---|
| TW | 201421754 | 6/2014 |

OTHER PUBLICATIONS

Taiwanese Office Action for Taiwanese Patent Application No. 104101444 dated Apr. 11, 2016, 7 Pages.
(Continued)

*Primary Examiner* — Binh B Tran
(74) *Attorney, Agent, or Firm* — Amin, Turocy & Watson, LLP

(57) ABSTRACT

An electronic package is provided, which includes: an insulating layer; an electronic element embedded in the insulating layer and having a sensing area exposed from the insulating layer; and a circuit layer formed on the insulating layer and electrically connected to the electronic element, thereby reducing the thickness of the overall package structure.

16 Claims, 6 Drawing Sheets

(51) Int. Cl.
*H05K 7/00* (2006.01)
*H05K 3/28* (2006.01)

(56) References Cited

U.S. PATENT DOCUMENTS

| | | | | |
|---|---|---|---|---|
| 2008/0096321 A1* | 4/2008 | Lin | ................... | H01L 27/14618 |
| | | | | 438/113 |
| 2013/0026589 A1* | 1/2013 | Wu | ................... | H01L 27/14618 |
| | | | | 257/432 |
| 2014/0239463 A1 | 8/2014 | Chen et al. | | |

OTHER PUBLICATIONS

Taiwanese Office Action for Taiwanese Patent Application No. 104101444 dated Apr. 21, 2017, 6 Pages.

* cited by examiner

ELECTRONIC PACKAGE

BACKGROUND

1. Technical Field

The present disclosure relates to an electronic package, and more particularly, to a thin-type electronic package.

2. Description of Related Art

Along with the rapid development of electronic industries, electronic products are developed toward the trend of miniaturization and multi-function. Accordingly, various types of packages have been developed.

Generally, electronic elements of sensor elements and camera lenses are packaged to form wire-bonding or COB (Chip on Board) type package structures.

FIG. 1A is a schematic cross-sectional view of a conventional wire-bonding type package structure 1. Referring to FIG. 1A, the conventional wire-bonding type package structure 1 has a substrate 10, an electronic element 13 disposed on the substrate 10, and an encapsulant 18 formed on the substrate 10 and encapsulating the electronic element 13.

A first circuit layer 11 and a second circuit layer 12 are formed on upper and lower sides of the substrate 10, respectively, and a plurality of conductors 14 such as conductive through holes or conductive vias are formed in the substrate 10 for electrically connecting the first circuit layer 11 and the second circuit layer 12. Further, a first insulating layer 16 is formed on the upper side of the substrate 10, and portions of the first circuit layer 11 are exposed from the first insulating layer 16. A second insulating layer 17 is formed on the lower side of the substrate 10, and portions of the second circuit layer 12 are exposed from the second insulating layer 17. Furthermore, a plurality of conductive elements 15 are formed on the exposed portions of the second circuit layer 12.

The electronic element 13 is disposed on the upper side of the substrate 10 and electrically connected to the first circuit layer 11 through a plurality of gold wires 130. The electronic element 13 is a sensor element, which has a sensing area 131 formed on an upper surface thereof for fingerprint identification.

The electronic element 13 and the gold wires 130 are encapsulated by the encapsulant 18.

In the conventional wire-bonding type package structure 1, the sensing area 131 is covered by the encapsulant 18. The encapsulant 18 covering the sensing area 131 is required to have a very small thickness d with high precision so as to ensure effective sensing of the electronic element 13.

However, the gold wires 130 have a certain wire loop, and the molding process needs a sufficient height to allow the electronic element 13 to be uniformly encapsulated by the encapsulant 18. As such, the thickness of the encapsulant 18 is difficult to control and thinning of the wire-bonding type package structure 1 cannot be achieved.

FIG. 1B is a schematic cross-sectional view of a conventional COB type package structure 1'. Referring to FIG. 1B, the conventional COB type package structure 1' has a substrate 10', an electronic element 13 of a camera lens disposed on the substrate 10', a transparent element 19 disposed on the electronic element 13, and an encapsulant 18 formed on the substrate 10' and encapsulating the electronic element 13 and the transparent element 19.

The structure of the substrate 10' can be referred to the structure of FIG. 1A.

The electronic element 13 is disposed on an upper side of the substrate 10' and electrically connected to the substrate 10' through a plurality of gold wires 130. The electronic element 13 has a sensing area 131 formed on an upper surface thereof for light sensing.

The transparent element 19 is disposed on the upper surface of the electronic element 13 through a plurality of support members 190 and covers the sensing area 131 of the electronic element 13.

The encapsulant 18 is made of a non-transparent material. The encapsulant 18 is formed on the upper side of the substrate 10 and encapsulates the transparent element 19, the electronic element 13 and the gold wires 130. An upper surface of the transparent element 19 is exposed from the encapsulant 18.

In the conventional COB type package structure 1', the camera lens is required to be thinned. However, since the electronic element 13 is attached to the substrate 10' and the transparent element 19 is disposed on the electronic element 13 through the support members 190, it is not easy to thin the COB type package structure 1'.

Accordingly, through silicon via (TSV) technologies are used to overcome the above-described drawbacks. FIG. 1C is a schematic cross-sectional view of a conventional light-sensing package structure 1". Referring to FIG. 1C, the conventional light-sensing package structure 1" has a silicon substrate 10" and a transparent element 19' disposed on the silicon substrate 10".

A first circuit layer 11 and a second circuit layer 12 are formed on upper and lower sides of the silicon substrate 10", respectively, and a plurality of conductive through silicon vias 100 are formed in the silicon substrate 10" for electrically connecting the first circuit layer 11 and the second circuit layer 12. Further, a sensing area 131 is formed on the upper side of the silicon substrate 10". An insulating layer 17' is formed on the lower side of the silicon substrate 10", and portions of the second circuit layer 12 are exposed from the insulating layer 17'. Further, a plurality of conductive elements 15 are formed on the exposed portions of the second circuit layer 12.

The transparent element 19' is attached to the upper side of the silicon substrate 10" through an adhesive layer 190' and covers the sensing area 131.

However, the conductive through silicon vias 100 are difficult to fabricate and integrate and have a high fabrication cost, especially when they are applied in electronic elements of sensor elements and camera lenses.

Therefore, there is a need to provide an electronic package structure so as to overcome the above-described drawbacks.

SUMMARY

In view of the above-described drawbacks, the present disclosure provides an electronic package, which comprises: a first insulating layer having opposite first and second surfaces; an electronic element embedded in the first insulating layer and having at least a sensing area and a plurality of electrode pads exposed from the first surface of the first insulating layer; and a first circuit layer formed on the first surface of the first insulating layer, wherein the first circuit layer is in contact with the electrode pads and thus in electrical connection with the electronic element, and the sensing area is exposed from the first circuit layer.

The above-described electronic package can further comprise a second circuit layer formed on the second surface of the first insulating layer and electrically connected to the first circuit layer. Further, a third insulating layer can be formed on the second surface of the first insulating layer and the second circuit layer. Portions of the second circuit layer can be exposed from the third insulating layer. The second circuit layer can be in contact with the electronic element or not.

Further, a second insulating layer can be formed on the first surface of the first insulating layer and the first circuit layer, and the sensing area is exposed from the second insulating layer. Portions of the first circuit layer can be exposed from the second insulating layer.

The present disclosure provides another electronic package, which comprises: a first insulating layer having opposite first and second surfaces; an electronic element embedded in the first insulating layer and having at least a sensing area and a plurality of electrode pads exposed from the first surface of the first insulating layer; a first circuit layer formed on the first surface of the first insulating layer, wherein the first circuit layer is in contact with the electrode pads and thus in electrical connection with the electronic element, and the sensing area is exposed from the first circuit layer; and a second insulating layer covering the sensing area of the electronic element.

The above-described electronic package can further comprise a second circuit layer formed on the second surface of the first insulating layer and electrically connected to the first circuit layer. A third insulating layer can be further formed on the second surface of the first insulating layer and the second circuit layer. Portions of the second circuit layer can be exposed from the third insulating layer. The second circuit layer can be in contact with the electronic element or not.

The second insulating layer can be further formed on the first surface of the first insulating layer and the first circuit layer. Portions of the first circuit layer can be exposed from the second insulating layer.

The above-described electronic packages can further comprise a plurality of conductive posts embedded in the first insulating layer and electrically connected to the first circuit layer.

The above-described electronic packages can further comprise a plurality of conductive elements formed on the second surface of the first insulating layer.

The above-described electronic packages can further comprise a redistribution layer (RDL) structure formed on the second surface of the first insulating layer and electrically connected to the first circuit layer.

The above-described electronic packages can further comprise a transparent element covering the sensing area of the electronic element.

By embedding the electronic element in the insulating layer and electrically connecting the first circuit layer to the electronic element, the present disclosure does not need to consider the wire loop of bonding wires or the thickness of an encapsulant as in the prior art. As such, the thickness of the insulating layer is easy to control, thereby achieving a better uniformity and a greatly reduced thickness.

DETAILED DESCRIPTION OF PREFERRED EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "on", "first", "second", "a," etc. are merely for illustrative purposes and should not be construed to limit the scope of the present disclosure.

FIGS. 2A to 2E are schematic cross-sectional views of electronic packages 2a to 2e according to a first embodiment of the present disclosure. The electronic packages 2a to 2e are applicable in, for example, fingerprint identifiers and image sensors.

Figure 1A:
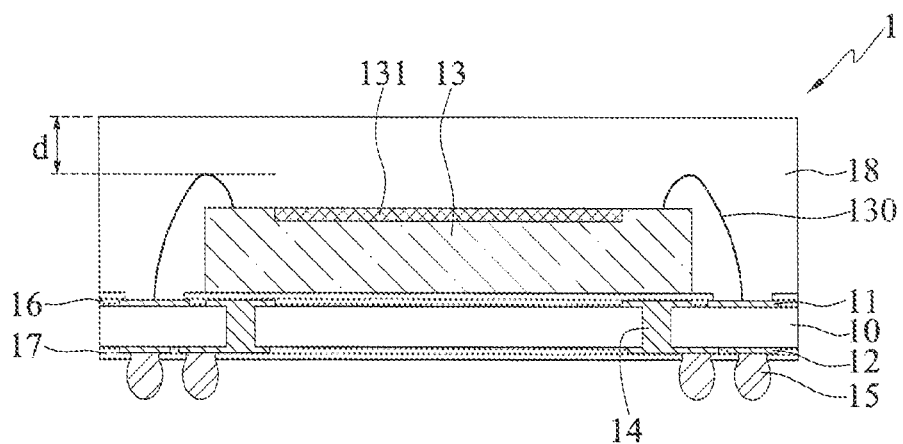
FIG. 1A is a schematic cross-sectional view of a conventional wire-bonding type package structure.
Figure 1B:
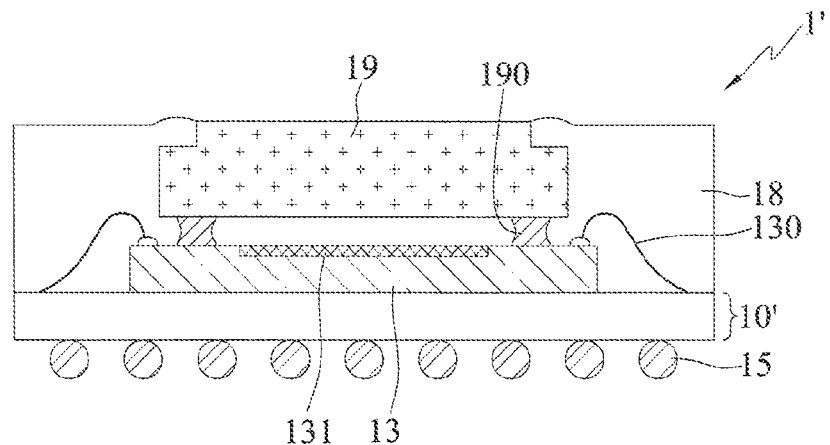
FIG. 1B is a schematic cross-sectional view of a conventional COB type package structure.
Figure 1C:
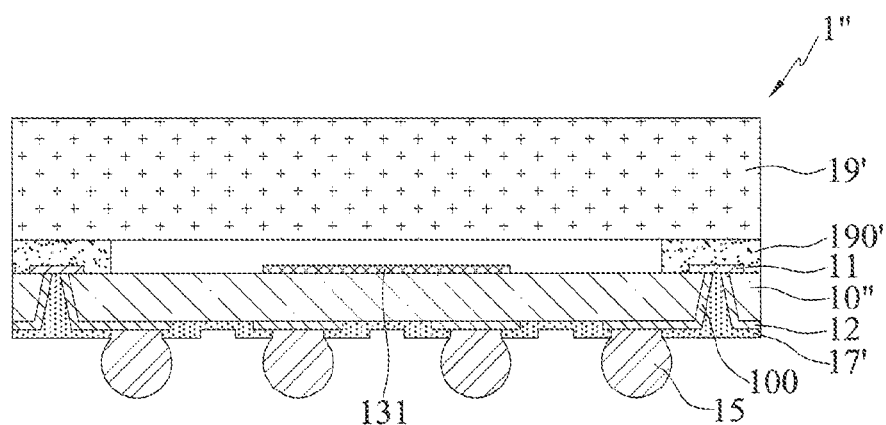
FIG. 1C is a schematic cross-sectional view of a conventional light-sensing package structure.
Figure 2A:
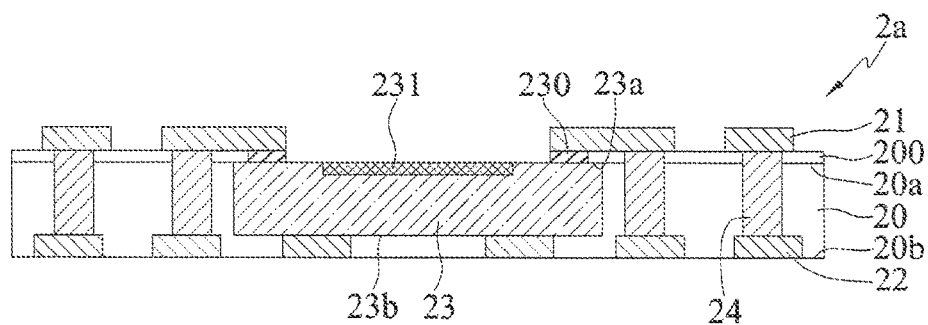
FIGS. 2A to 2E are schematic cross-sectional views of electronic packages according to a first embodiment of the present disclosure, wherein FIGS. 2A' and 2B' show other embodiments of FIGS. 2A and 2B, respectively.
Figure 2A:
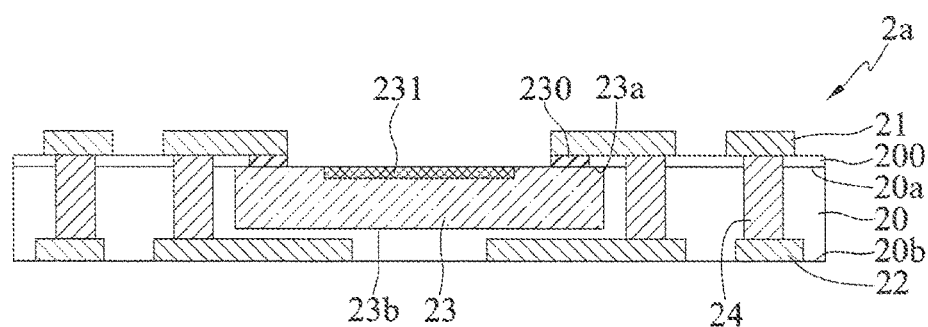

Referring to FIG. 2A, the electronic package 2a has: a first insulating layer 20 having opposite first and second surfaces 20a, 20b; an electronic element 23 embedded in the first insulating layer 20; a plurality of conductive posts 24 formed in the first insulating layer 20; and a first circuit layer 21 and a second circuit layer 22 formed on the first and second surfaces 20a, 20b of the first insulating layer 20, respectively.

In the present embodiment, the first insulating layer 20 is made of a molding compound, or a dielectric material such as an epoxy resin, polyimide or other photosensitive or non-photosensitive organic resin. According to the practical need, another insulating layer 200 can be formed on the first surface 20a of the first insulating layer 20 and made of a material that is the same as or different from that of the first insulating layer 20. Further, the insulating layer 200 and the first insulating layer 20 can be formed at the same time.

In the present embodiment, the electronic element 23 is a sensor element, which has an active surface 23a with a sensing area 231 and a plurality of electrode pads 230 and an inactive surface 23b opposite to the active surface 23a. The sensing area 231 is a light sensing area or a fingerprint sensing area. The sensing area 231 and the electrode pads 230 of the electronic element 23 are exposed from the first surface 20a of the first insulating layer 20.

Since the electronic element 23 is embedded in the first insulating layer 20, the present disclosure dispenses with the conventional encapsulant, thus reducing the thickness of the overall structure.

The first circuit layer 21 is formed on the first surface 20a of the first insulating layer 20 and in contact with the electrode pads 230 and thus in electrical connection with the electronic element 23. The sensing area 231 of the electronic element 23 is exposed from the first circuit layer 21. In the present embodiment, the first circuit layer 21 is made of such as copper and formed by patterned electroplating, deposition or etching.

The second circuit layer 22 is formed on the second surface 20b of the first insulating layer 20. In the present embodiment, the second circuit layer 22 is embedded in and exposed from the second surface 20b of the first insulating layer 20. The surface of the second circuit layer 22 is flush with or slightly lower than the second surface 20b of the first insulating layer 20.

The second circuit layer 22 is made of such as copper and formed by patterned electroplating, deposition or etching.

Further, a portion of the second circuit layer 22 is in contact with the inactive surface 23b of the electronic element 23 for heat dissipation.

The conductive posts 24 are embedded in the first insulating layer 20 and electrically connecting the first circuit layer 21 and the second circuit layer 22. But the first circuit layer 21 is not electrically connected to the inactive surface 23b of the electronic element 23.

In another embodiment, referring to FIG. 2A', the second circuit layer 22 is not in contact with the inactive surface 23b of the electronic element 23. That is, a portion of the first insulating layer 20 is sandwiched between the second circuit layer 22 and the inactive surface 23b of the electronic element 23. The conductive path constituted by the first circuit layer 21, the conductive posts 24 and the second circuit layer 22 extends below the inactive surface 23b of the electronic element 23.

Since the first circuit layer 21 is in direct electrical connection with the electronic element 23, the present disclosure dispenses with the conventional bonding wires, thus reducing the thickness of the overall structure.

Figure 2B:
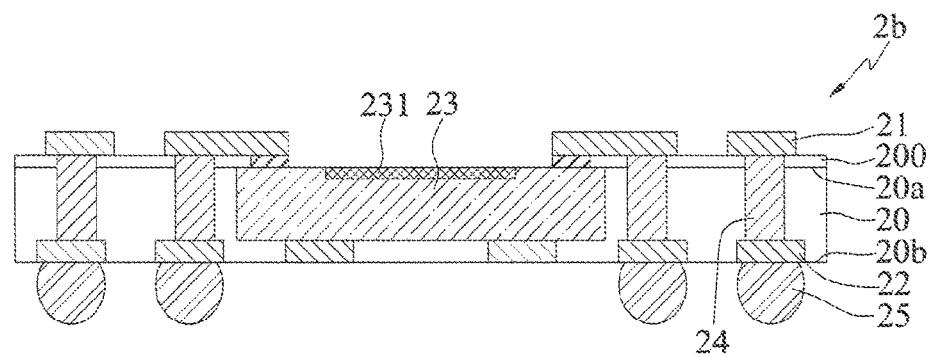
Figure 2B:
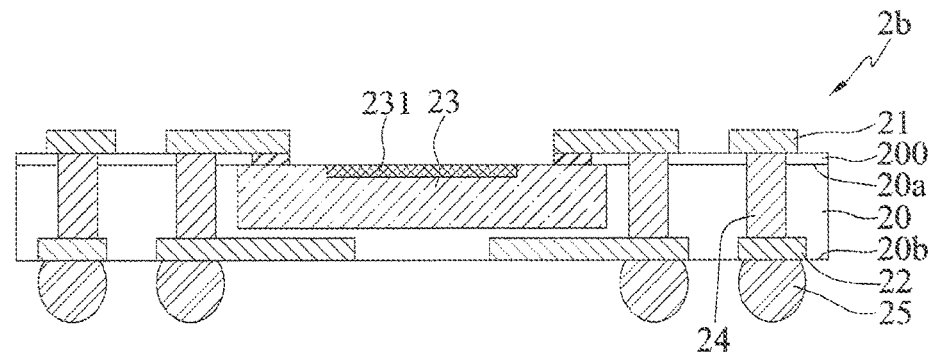

Referring to FIG. 2B, as compared to FIG. 2A, the electronic package 2b further has a plurality of conductive elements 25 formed on the second surface 20b of the first insulating layer 20. In particular, the conductive elements 25 are formed on and electrically connected to the second circuit layer 22.

In the present embodiment, the conductive elements 25 are, for example, solder balls, solder bumps or copper bumps.

In another embodiment, referring to FIG. 2B', similar to FIG. 2A', the second circuit layer 22 is not in contact with the inactive surface 23b of the electronic element 23. That is, a portion of the first insulating layer 20 is sandwiched between the second circuit layer 22 and the inactive surface 23b of the electronic element 23.

Figure 2C:
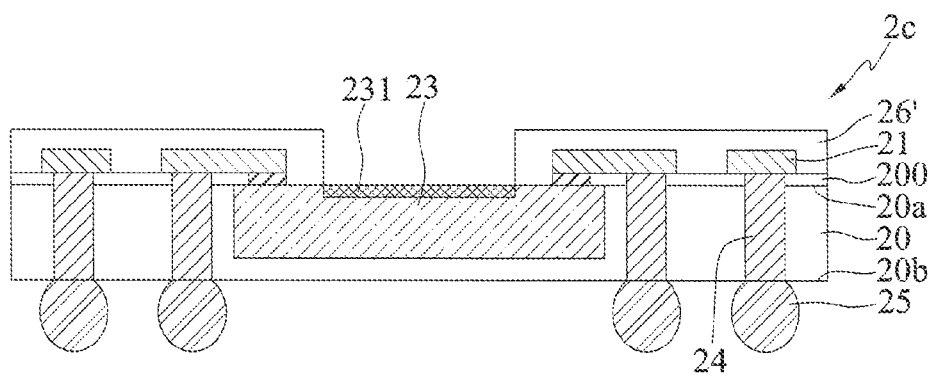

Referring to FIG. 2C, as compared to FIG. 2B, the electronic package 2c further has a second insulating layer 26' formed on the first surface 20a of the first insulating layer 20 and the first circuit layer 21, and the sensing area 231 of the electronic element 23 is exposed from the second insulating layer 26'. The second insulating layer 26' is made of, for example, a dielectric material.

In addition, the second circuit layer 22 can be omitted, and the conductive elements 25 can be in direct contact with the conductive posts 24.

Figure 2D:
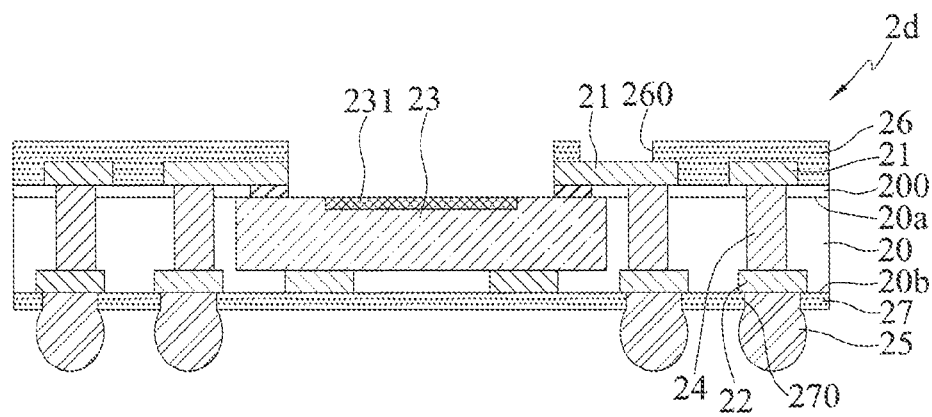

Referring to FIG. 2D, as compared to FIGS. 2B and 2C, the second insulating layer 26 is a dielectric layer or a solder mask layer, and portions of the first circuit layer 21 are exposed from the second insulating layer 26. For example, the second insulating layer 26 has a plurality of first openings 260 exposing portions of the first circuit layer 21. Alternatively, the surface of the second insulating layer 26 is flush with the surface of the first circuit layer 21 so as to expose the first circuit layer 21.

The electronic package 2d further has a third insulating layer 27 formed on the second surface 20b of the first insulating layer 20 and the second circuit layer 22. The third insulating layer 27 is, for example, a dielectric layer or a solder mask layer.

Portions of the second circuit layer 22 are exposed from the third insulating layer 27 and the conductive elements 25 are formed on the exposed portions of the second circuit layer 22. For example, the third insulating layer 27 has a plurality of second openings 270 exposing portions of the second circuit layer 22. Alternatively, the surface of the third insulating layer 27 is flush with the surface of the second circuit layer 22. As such, the surface of the second circuit layer 22 is exposed from the third insulating layer 27 for mounting the conductive elements 25.

Figure 2E:
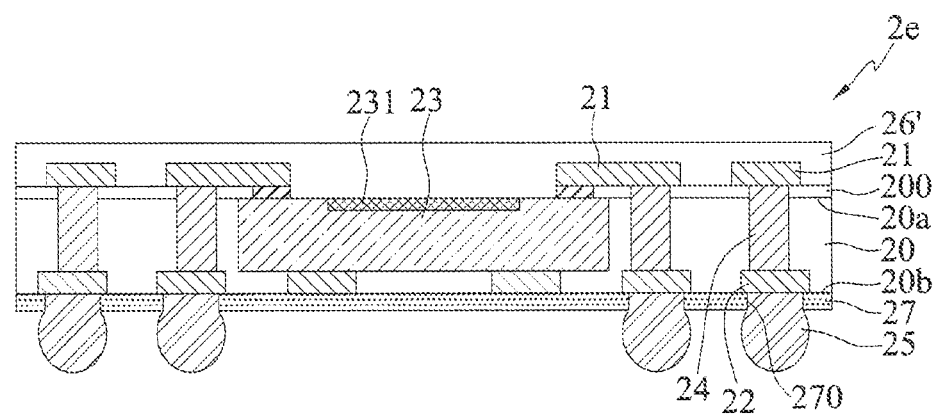

Referring to FIG. 2E, as compared to FIGS. 2C and 2D, the second insulating layer 26' covers and hence seals the sensing area 231 of the electronic element 23.

Figure 3A:
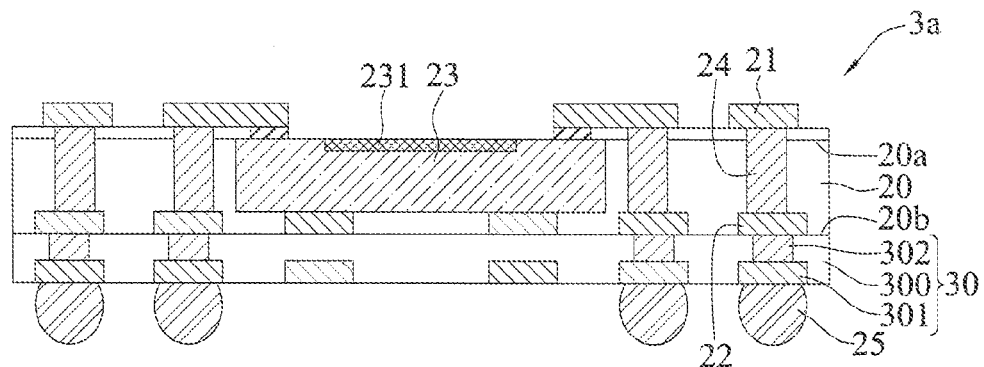
FIGS. 3A to 3C are schematic cross-sectional views of electronic packages according to a second embodiment of the present disclosure, wherein FIGS. 3A' and 3B' show other embodiments of FIGS. 3A and 3B, respectively.
Figure 3A:
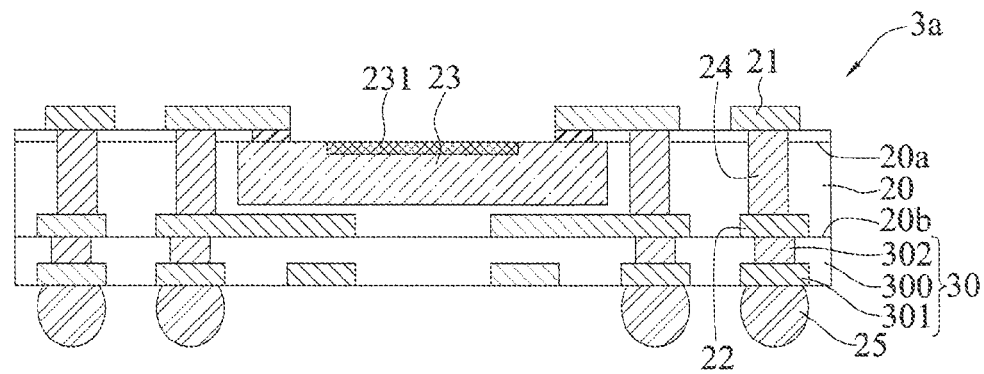
Figure 3B:
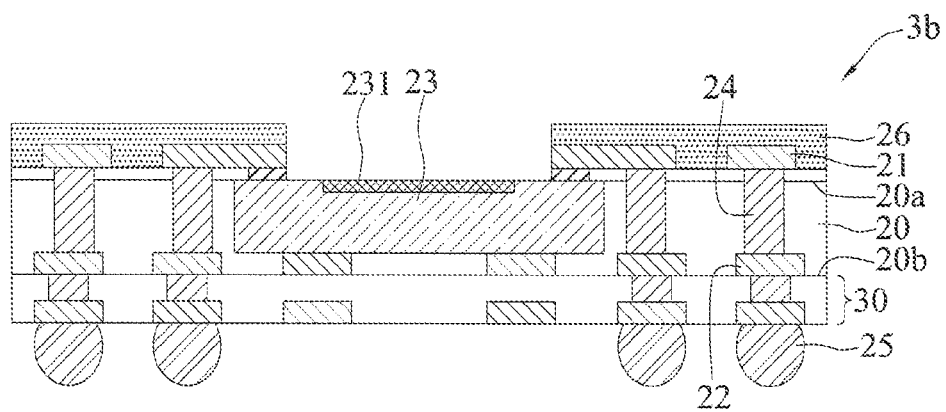
Figure 3B:
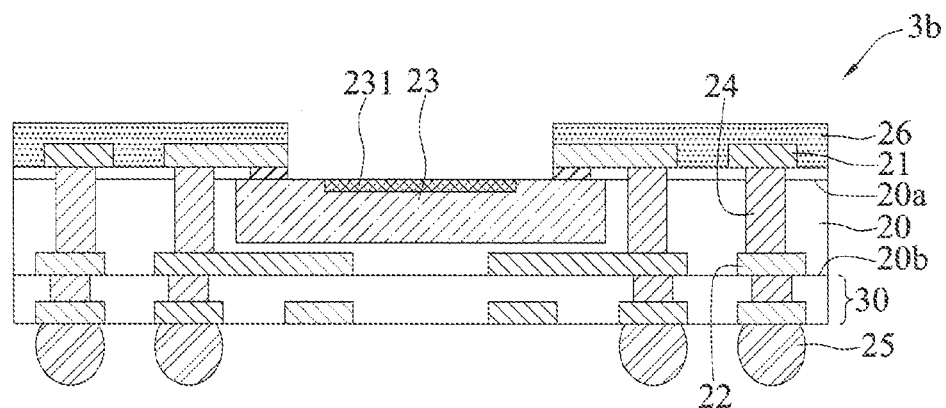
Figure 3C:
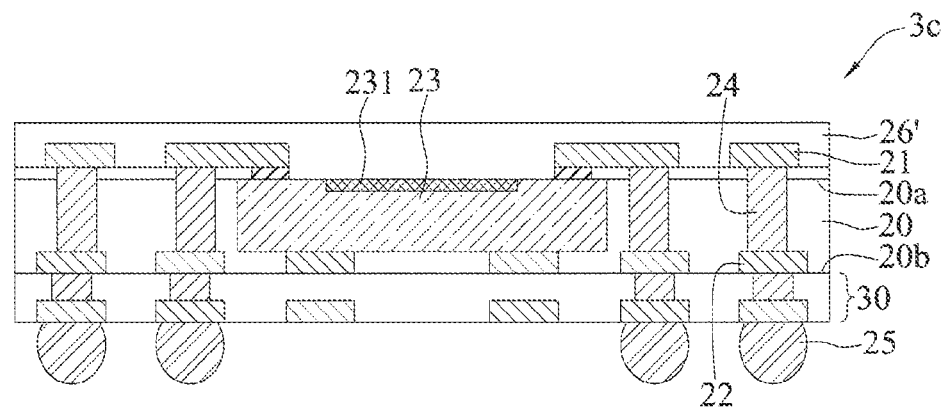

FIGS. 3A to 3C are schematic cross-sectional views of electronic packages 3a to 3c according to a second embodiment of the present disclosure. The present embodiment differs from the first embodiment in the circuit layer structure.

Referring to FIGS. 3A and 3A', as compared to FIGS. 2A and 2A', the electronic package 3a further has an RDL (Redistribution Layer) structure 30 formed on the second surface 20b of the first insulating layer 20 and electrically connected to the first circuit layer 21 through the second circuit layer 22 and the conductive posts 24.

In the present embodiment, the RDL structure 30 has at least a dielectric layer 300 and a circuit layer 301 formed on the dielectric layer 300 and electrically connected to the second circuit layer 22 through conductive posts 302 formed in the dielectric layer 300.

The circuit layer 301 is exposed from the dielectric layer 300 for mounting the conductive elements 25.

Referring to FIGS. 3B and 3B', the electronic package 3b can further have a characteristic of FIG. 2C or 2D. For example, similar to FIG. 2C, a second insulating layer 26 such as a dielectric layer or a solder mask layer is formed on the first surface 20a of the first insulating layer 20 and the first circuit layer 21, and the sensing area 231 of the electronic element 23 is exposed from the second insulating layer 26.

Referring to FIG. 3C, similar to FIG. 2E, the sensing area 231 of the electronic package 3c is covered by the second insulating layer 26' made of such as a dielectric material.

Figure 4A:
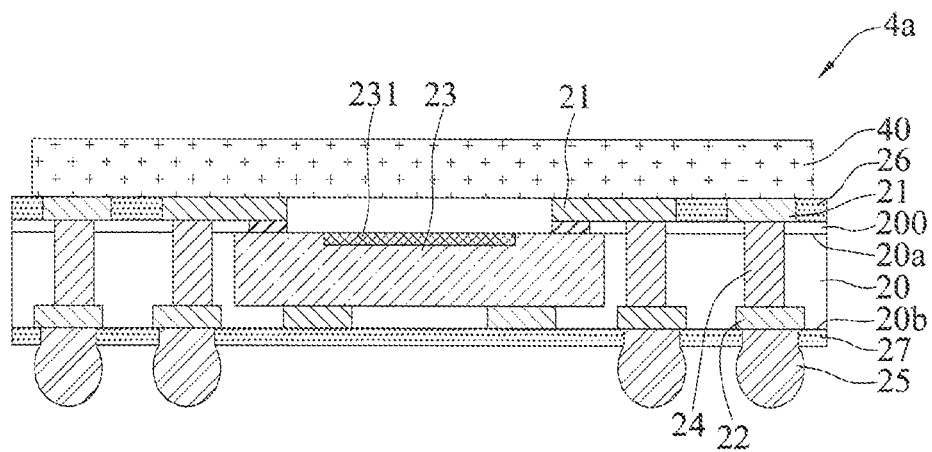
FIGS. 4A and 4B are schematic cross-sectional views of electronic packages according to a third embodiment of the present disclosure.
Figure 4B:
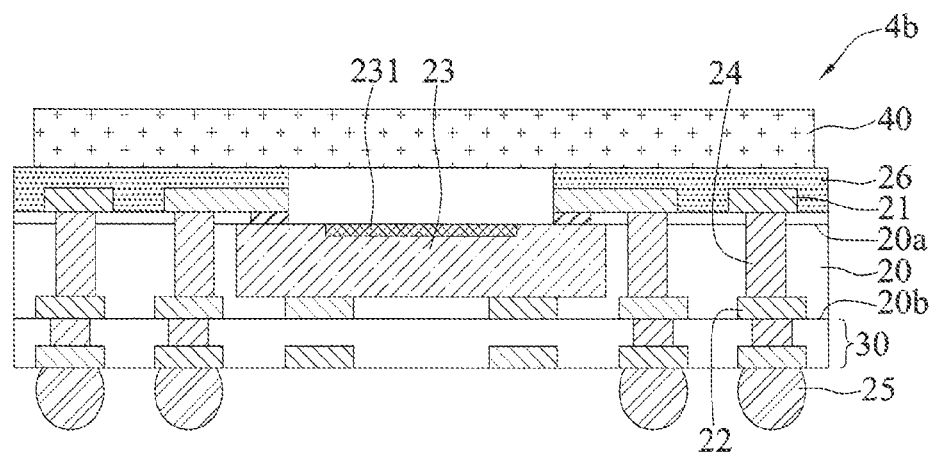

FIGS. 4A and 4B are schematic cross-sectional views of electronic packages 4a, 4b according to a third embodiment of the present disclosure. The present embodiment differs from the above-described embodiments in that the electronic packages 4a, 4b are applicable in camera lenses. In particular, a transparent element 40 is added.

Referring to FIGS. 4A and 4B, as compared to FIGS. 2D and 3B, the electronic packages 4a, 4b further has a transparent element 40 such as a lens or glass that covers the sensing area 231 of the electronic element 23. For example, the transparent element 40 is attached to the second insulating layer 26. As such, the present disclosure dispenses with the conventional support members so as to reduce the thickness of the overall structure.

In the electronic package 4a of FIG. 4A, the surface of the second insulating layer 26 is flush with the surface of the first circuit layer 21.

On the other hand, in the electronic package 4b of FIG. 4B, the first insulating layer 26 encapsulates the first circuit layer 21.

In the above-described electronic packages 2a to 2e, 3a to 3c and 4a to 4b, the electronic element 23 is embedded in the first insulating layer 20 and the first circuit layer 21 is electrically connected to the electronic element 23. As such, the present disclosure does not need to consider the wire loop of bonding wires or the thickness of an encapsulant as in the prior art. Therefore, the thickness of the first insulating layer 20 is easy to control, thus achieving a better uniformity and a greatly reduced thickness Further, since the present disclosure uses a non-semiconductor process, the fabrication cost is reduced.

Furthermore, the electronic packages 2a to 2e, 3a to 3c and 4a to 4b can be easily adjusted according to the practical need, thereby improving the design flexibility.

In addition, the above-described embodiments are applicable to LGA (Land Grid Array) or BGA (Ball Grid Array) packages.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a first insulating layer having opposite first and second surfaces;
   an electronic element embedded in the first insulating layer and having an active surface with at least a sensing area and a plurality of electrode pads exposed from the first surface of the first insulating layer and an inactive surface opposing the active surface;
   a first circuit layer formed on the first surface of the first insulating layer, wherein the first circuit layer is in contact with the electrode pads and in electrical connection with the electronic element, and the sensing area is exposed from the first circuit layer;
   a second circuit layer embedded in the second surface of the first insulating layer and electrically connected to the first circuit layer, wherein the second circuit layer is in contact with a part of the inactive surface of the electronic element and free from being in contact with corner portions of the inactive surface of the electronic element; and
   a plurality of solid conductive posts embedded in the first insulating layer and electrically connected to the first circuit layer and the second circuit layer, wherein the solid conductive posts are in direct contact with the first circuit layer and the second circuit layer.

2. The electronic package of claim 1, further comprising a second insulating layer formed on the first surface of the first insulating layer and the first circuit layer, wherein the sensing area is exposed from the second insulating layer.

3. The electronic package of claim 2, wherein portions of the first circuit layer are exposed from the second insulating layer.

4. The electronic package of claim 1, further comprising a third insulating layer formed on the second surface of the first insulating layer and the second circuit layer.

5. The electronic package of claim 4, wherein portions of the second circuit layer are exposed from the third insulating layer.

6. The electronic package of claim 1, further comprising a plurality of conductive elements formed on the second surface of the first insulating layer.

7. The electronic package of claim 1, further comprising a redistribution layer (RDL) structure disposed on the second surface of the first insulating layer and electrically connected to the first circuit layer.

8. The electronic package of claim 1, further comprising a transparent element covering the sensing area of the electronic element.

9. An electronic package, comprising:
   a first insulating layer having opposite first and second surfaces;
   an electronic element embedded in the first insulating layer and having an active surface with at least a sensing area and a plurality of electrode pads exposed from the first surface of the first insulating layer and an inactive surface opposing the active surface;
   a first circuit layer formed on the first surface of the first insulating layer, wherein the first circuit layer is in contact with the electrode pads and in electrical connection with the electronic element, and the sensing area is exposed from the first circuit layer;
   a second circuit layer embedded in the second surface of the first insulating layer and electrically connected to the first circuit layer, wherein the second circuit layer is in contact with a part of the inactive surface of the electronic element and free from being in contact with corner portions of the inactive surface of the electronic element;
   a plurality of solid conductive posts embedded in the first insulating layer and electrically connected to the first circuit layer and the second circuit layer, wherein the solid conductive posts are in direct contact with the first circuit layer and the second circuit layer; and
   a second insulating layer covering the sensing area of the electronic element.

10. The electronic package of claim 9, further comprising a third insulating layer formed on the second surface of the first insulating layer and the second circuit layer.

11. The electronic package of claim 10, wherein portions of the second circuit layer are exposed from the third insulating layer.

12. The electronic package of claim 9, further comprising a plurality of conductive elements formed on the second surface of the first insulating layer.

13. The electronic package of claim 9, wherein the second insulating layer is further formed on the first surface of the first insulating layer and the first circuit layer.

14. The electronic package of claim 13, wherein portions of the first circuit layer are exposed from the second insulating layer.

15. The electronic package of claim 9, further comprising a redistribution layer (RDL) structure formed on the second surface of the first insulating layer and electrically connected to the first circuit layer.

16. The electronic package of claim 9, further comprising a transparent element covering the sensing area of the electronic element.

* * * * *